United States Patent
Urala

(10) Patent No.: US 6,587,533 B1
(45) Date of Patent: Jul. 1, 2003

(54) METHOD FOR ATTENUATING TRANSIENTS CAUSED BY ALIGNING IN A DESYNCHRONIZER

(75) Inventor: Reino Urala, Helsinki (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 09/331,218

(22) PCT Filed: Dec. 16, 1997

(86) PCT No.: PCT/FI97/00788

§ 371 (c)(1), (2), (4) Date: Jul. 30, 1999

(87) PCT Pub. No.: WO98/31117

PCT Pub. Date: Jul. 16, 1998

(30) Foreign Application Priority Data

Dec. 17, 1996 (FI) .................................................. 965072

(51) Int. Cl.⁷ ................................................ H03D 3/24
(52) U.S. Cl. ....................................................... 375/376
(58) Field of Search ................................. 375/376, 215, 375/375, 327; 329/325; 327/147, 156; 342/103

(56) References Cited

U.S. PATENT DOCUMENTS

| | | |
|---|---|---|
| 5,245,636 A | 9/1993 | Sari et al. |
| 5,404,380 A | 4/1995 | Powell et al. |
| 5,457,717 A | 10/1995 | Bellamy |
| 5,497,405 A | 3/1996 | Elliott et al. |
| 5,604,773 A | 2/1997 | Urala |
| 5,680,422 A * | 10/1997 | Burch et al. ................ 370/505 |
| 6,229,863 B1 * | 5/2001 | Rude ........................... 370/505 |

FOREIGN PATENT DOCUMENTS

| | | |
|---|---|---|
| AU | A34689/89 | 11/1989 |
| EP | 0 481 847 | 4/1992 |
| EP | 0 630 127 | 12/1994 |
| EP | 0 727 887 | 8/1996 |
| FI | 90709 | 8/1993 |
| FI | 95636 | 8/1993 |
| GB | 2 300 543 | 11/1996 |
| WO | 93/16535 | 8/1993 |

OTHER PUBLICATIONS

Copy of International Search Report.
Copy of Finnish Search Report.
"Simulation Results and Field Trial Experience of Justification Jitter", International Telecommunication Union, Geneva, 1991.

* cited by examiner

*Primary Examiner*—Khai Tran
(74) *Attorney, Agent, or Firm*—Squire, Sanders & Dempsey, L.L.P.

(57) ABSTRACT

The invention relates to a method to attenuate transients caused in the desynchroniser by justification events in a digital transmission system. The analogue circuit arrangement realizing the method comprises a by-pass input for receiving the three-state signal (BPin), whereby the signal (BPin) represents justification events upwards and/or downwards, filtering means (R8 and C8) for filtering the pulse signal (BPin), and adding means (AMP2) for adding the filtered pulse signal to the output signal of the loop filter (AMP1), whereby the added output signal controls the loop oscillator (VCO).

9 Claims, 7 Drawing Sheets

Fig. 13
PRIOR ART
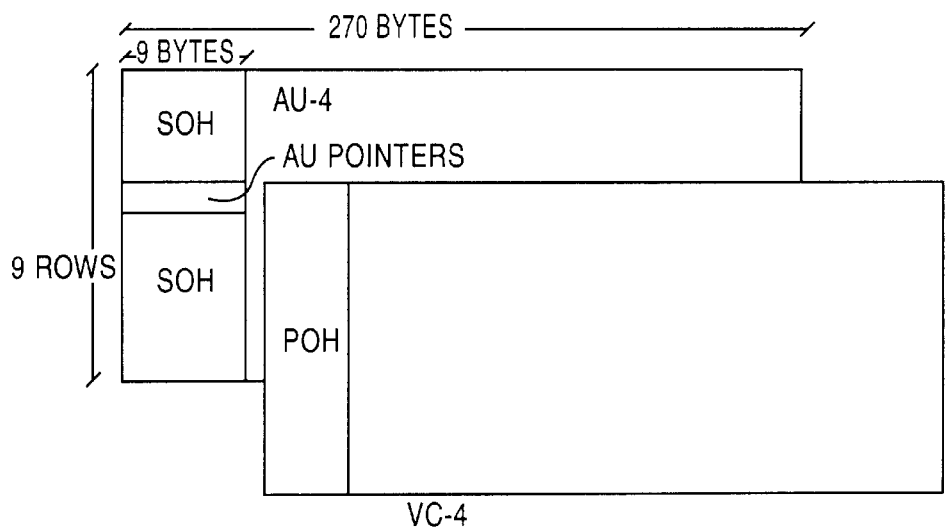
Fig. 14
PRIOR ART
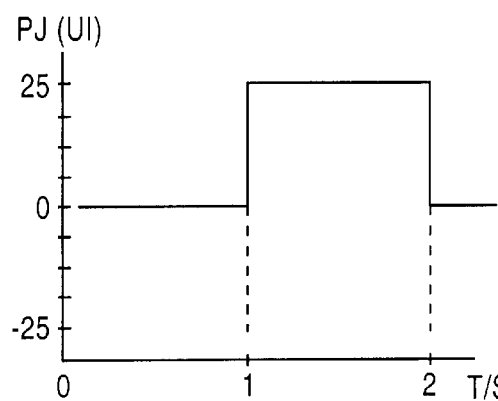
Fig. 15
PRIOR ART
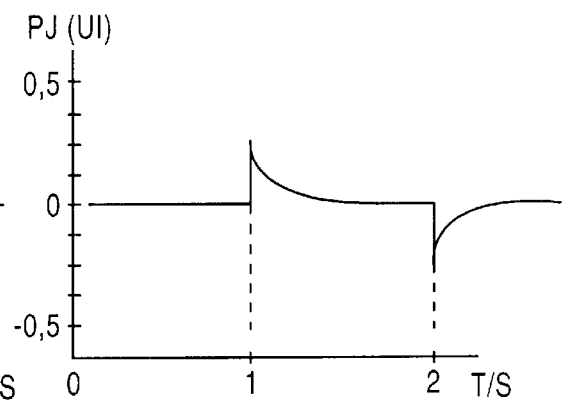
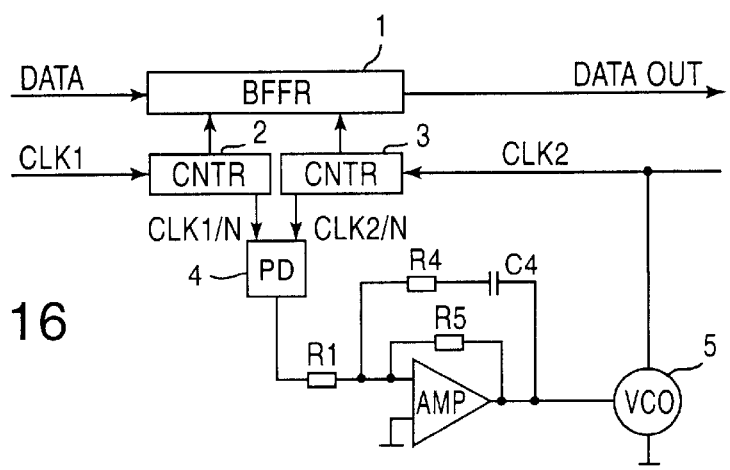
Fig. 16

METHOD FOR ATTENUATING TRANSIENTS CAUSED BY ALIGNING IN A DESYNCHRONIZER

FIELD OF THE INVENTION

The object of the invention is a method according to the preamble of claim 1 for attenuating transients caused by the transmission system's justification events in a desynchroniser. The invention also relates to a circuit arrangement for realising the method.

BACKGROUND OF THE INVENTION

In order to standardise and improve digital communication by wire the synchronous digital hierarchy was developed in order to replace the present, the so called plesiochronic system. As a concept the synchronous digital hierarchy means firstly that all nodes in a digital communications network are basically synchronised to the same clock, and secondly that the transmitted data is arranged into frames, which are defined on several levels according to a hierarchic order. The essential definitions regarding the operation of the arrangement are contained in the ITU specifications G.703, G.70X (Draft) and G.781–G.784. The transmitted data frames are called STM-N frames, where STM is an abbreviation for Synchronous Transport Module and N refers to the number of the hierarchy level. The frames of the lowest hierarchy level are STM-1 frames and they are used for instance in the present 2, 8, 34 and 140 Mbit/s PCM systems. for packing the transmitted data. The transmission rate of the STM-1 frames or the so called basic rate in the SDH system is 155,520 Mbit/s. On the higher hierarchy levels the transmission rates are multiples of this lowest level rate.

The structure of an STM-1 frame is illustrated in FIG. 13. It can be represented by a matrix having 9 rows and 270×N columns. The matrix elements are bytes, so that one frame contains 2430×N bytes. The 9×N first columns of the matrix comprise header and address information, so that the rows 1 to 3 and 5 to 9 of these columns belong to the so called section overhead (SOH) and the row 4 comprises the pointers of so called administrative units (AU). The rest of the STM-1 transmission frame comprises one or more administrative units. The example shows an AU unit AU-4 of the highest level, in which, correspondingly, is placed a highest level virtual container VC-4 in which for instance a 139264 kbit/s plesiochronic information signal can be directly mapped. Alternatively the transmission frame STM-1 can contain several lower level AU units, and into each of these unit is placed a virtual container VC of the corresponding lower level. In FIG. 13 the VC-4 on the other hand is formed by a path overhead POH of one byte and an information bit group of 240 bytes, whereby a particular control byte is placed at the beginning of each. Some of these control bytes are used i.a. to perform the interface justification in connection with the mapping, when the rate of the mapped information signal is slightly offset from its nominal value. The mapping of the information signal into the transmission frame STM-1 is described for instance in the patent applications AU-B-34689/89 and FI-914746.

A tributary unit (TU) forms the connection between a higher and a lower hierarchy level. It comprises a payload, or the VC frame, and a pointer, which indicates where the payload is positioned in the TU frame. The administrative unit (AU) and the tributary unit (TU) differ in that the AU is an assembly which can be cross connected in the network and transmitted between different STM signals, but the TU is an internal unit of a particular frame, and the TU can not be transmitted between different STM-1 signals without an administrative unit of a higher level. One or more tributary units (TU) having a fixed position in a higher level VC frame form a tributary unit group (TUG), which is formed by multiplexing the TU's. A group can be formed by tributary units of different sizes.

A container (C) is the synchronous payload of each VC. It comprises a payload signal whose frequency can be justified when required so that will be synchronous with the corresponding STM-1 signal. In the future a container can also be a broadband signal.

Each byte in the AU-4 unit has a position number. The above mentioned AU pointer contains the address of the position of the first byte of the VC-4 container in the AU4 unit. With the aid of the pointers it is also possible to perform so called positive or negative pointer justification in different points of the SDH network. If a network node operating at a certain clock frequency receives from the outside a VC having a clock frequency which is higher than the above mentioned the result will be that the data buffer is filled. Then a so called negative justification must be performed. Then one byte from the received VC container is moved to the header side and the number of the pointer is correspondingly reduced by one.

On the other hand, if a received VC has a lower rate than the clock rate of the node, then the data buffer tends to empty, and a positive justification must be made, where a fill byte is added to the VC container, and the pointer value is increased by one.

Both the bit justification used in mapping (interface justification) and the above mentioned pointer justification generate phase jitter, which the desynchroniser should be able to equalise at the exit from the SDH network. Phase jitter and its equalisation is described for instance in the lecture "Simulation results and field trial experience of justification jitter" by Ralph Urbansky, 6th World Telecommunication Forum, Geneva, Oct. 10–15, 1991, International Telecommunication Union, Part 2, Vol III, p. 45–49.

Two principles for filtering jitter and fluctuations have been adopted in SDH desynchronisers. The simpler of these is based on a phase-locked loop (PLL) and it is often called a "narrow bandwidth desynchroniser", because the filtering of even the worst pointer justification events (PJE) is made only with this phase-locked loop. The more complex solution is called a "bit-leaking desynchroniser", because PJE phase hits are prejustified in a jitter spreading process (=bit spreading) before the actual PLL loop. In a bit-leaking desynchroniser the bandwidth of the PLL loop is about one decade wider than the bandwidth of the PLL loop in a narrow bandwidth desynchroniser.

For this purpose the known desynchronisers comprise a data buffer, to which is connected an analogue phase-locked loop, with which the data buffer read clock is phase-locked to the read clock. As the phase-locked loop acts as a low-pass filter it removes the jitter, except components at the lowest frequencies. For instance the SDH pointer justification generates typically much stronger jitter components than the bit stuffing, because single phase hits in the pointer justification are for instance 8 or 24 frame unit intervals UI, and because the frequency of the phase hits caused by pointer justification can represent a very low frequency, which is poorly filtered in the phase-locked loop of the desynchroniser. A sufficient attenuation of the pointer jitter with the aid filtering would require that the bandwidth of the loop is designed to be very narrow (the absolute value depends on the rate of the interface in question). The FIGS. 14 and 15 show how the jitter peaks of two pointer phase hits of 24 UI (measured at the desynchroniser output by a measuring filter defined by ITU) can be reduced with strong filtering to an acceptable peak level of about 0.2 UI, when the bandwidth of the phase-locked loop at the rate 140 Mbit/s is about 2 Hz. However, no pointer justifications are required in normal operating conditions, and only the interface bit justifications are active. Thus the dimensioning of the phase-locked loops of the desynchronisers on the basis of pointer phase hits is un-reasonable, because regarding the bit stuffing the bandwidth of the phase-locked loop could be even ten-fold. Then the locking of the loop would also be more reliable and the locking time would be substantially shorter.

A known solution to this problem is the so called bit leaking, where the phase hits caused by the pointer are removed in a non-linear process (in the time domain), which treats the input data bits in a separate serial buffer so that the phase of the write clock and the data supplied to the actual desynchroniser is cyclically shifted forwards (or backwards), and in this way the step-like phase hit is transformed into a linear phase shift performed during a longer interval. Then the pointer phase hits are treated separately with a bit leaking buffer, whereby the phase-locked loop of the actual desynchroniser can be dimensioned with a wider bandwidth according to the requirements of the bit stuffing. Problems with the "bit leaking" solution are the serial data processing on the bit level and the rather complicated logic. In principle the bit leaking solution is better, but in practice the intelligence of the bit leaking circuits seems insufficient for the filtering of special PJE sequences, because they can not detect all special forms of the PJE sequences. Further the effects of the noise in the network clock and the deficiencies of the internal circuit design can be disadvantageous, because they are not filtered as effectively as in the narrow bandwidth solution. Further it must be noted that it is not sufficient to process one pointer at a time, but in the worst case the logic should be able to process tens of interleaved pointer phase hits in different cancellation phases. Thus the use of said technique in a fast 140 Mbit/s desynchroniser is not considered practical i.a. due to the increased power consumption.

The narrow bandwidth design is in principle simple and uncomplicated, but the locking of it requires extra circuits, and it is not completely transparent to a tributary unit signal. Frequency offset transients in the tributary signal, such as the alarm indication signal (AIS) switching and the channel switching, tend to generate heavy and long variations in the filling of the data buffer, or data delays. The delay is not determined by the 0.3 Hz bandwidth, but the long delay depends on the shorter time constant of the second order PLL loop amplifier, which is reflected into the final result as time constants of 10 s, 20 s, . . . or more.

In practice there are further incompatibility problems: the desynchroniser must be sufficiently robust, so that it can co-operate with mappers, pointer processors and clock sources of other manufacturers, and so that it can function disregarding design errors or abnormal behaviour of other manufacturer's equipment. Thus good test results in the own testing environment or in an environment with self-manufactured equipment do not always guarantee proper operation in the field.

The object of the invention is to provide a simple and advantageous arrangement for by-passing tributary signal clock frequency hits in a desynchroniser which is also suited for 140 Mbit/s and higher rates. A primary object is an additional circuit arrangement in a narrow bandwidth desynchroniser. A particular object is to avoid problems, which are caused when the desynchroniser buffer is filled, or problems caused by a strong oscillation which occur in common solutions with one phase-locked loop.

The title of the Finnish patent no. 95636 is "Desynkronisaattori ja menetelmä osoitinvärinän vaimentamiseksi desynkronisaattorissa" (A desynchroniser and a method to attenuate pointer jitter in a desynchroniser). In this method the phase jitter caused by the phase hits in the desynchroniser's input signal are modulated to a frequency, which is substantially higher than the bandwidth of the phase-locked loop.

The title of the Finnish patent no. 90709 is "Järjestely osoitinvärinäin vaimentamiseksi desynkronisaattorissa" (An arrangement for attenuating pointer jitter in a desynchroniser). In this arrangement the jitter amplitude caused by justification operations is attenuated by means, with which the phase-locked loop is forced, synchronised to the occurrence of each justification, to limit the maximum amplitude of the phase jitter caused by said pointer justification in the desynhcroniser output signal.

BRIEF SUMMARY OF THE INVENTION

However, in these patents no transparency is provided in the desynchroniser to transients appearing in the tributary unit clock signal.

The objects of the present invention mentioned above are attained with a method according to the invention, which is presented in the characterising clause of claim 1.

As noted above, the frequency of occurrence of phase hits caused by the pointer justifications may represent a very low frequency, which is not readily filtered in the phase-locked loop of the desynchroniser. The inventive idea is to by-pass the phase-locked signal so that the transient acts directly on the oscillator of the phase-locked loop, whereby the oscillator substantially conveys the transient to the address counters of the desynchroniser. Then, particularly in a narrow bandwidth desynchroniser, a substantially lower output jitter is obtained. Here it must be noted that a phase transient of the tributary unit signal is not jitter, but a signal characteristic.

A circuit arrangement realising the method according to the invention is presented in claim 5.

The signal processing according to the invention can be performed digitally, in a byte based 8-bit parallel mode which is natural to SDH, and which is used also in other connections in the desynchroniser.

The by-pass method according to the invention avoids problems caused by buffer filling or wide oscillations, which occur in conventional solutions with a single phase-locked loop. The method can be applied in any desynchroniser at any bit rate, but a particularly good result is obtained in a narrow bandwidth desynchroniser, as is shown below.

In principle the by-pass method of the present invention can be regarded as a feed forward control of the tributary signal's phase. The signal supplied to the by-pass input is obtained by studying the AU/TU-pointers in a way known per se. Then the phase-locked loop PLL and its feedback system only has to make the fine adjustment of a phase hit caused by the transient in the tributary signal.

In principle the method according to the invention could be applied also in other systems, and not only in the case of SDH.

The patent publication EP 0 481 847 A1 presents a device for attenuating jitter caused by pointer justification in a digital telecommunications network. The device contains a circuit with which justification bits are added adjacent to the phase hit caused by the pointer justification, whereby the justification bits are intended to remove the effects of these phase hits after they have passed through a conventional desynhcroniser. A control circuit is also arranged in the device so that when the phase hits caused by pointer justification comprise several bits, the control circuit divides the hits into hit elements and controls the addition of such elements in a manner which is adjusted according to the occurrence frequency of the pointer justifications. This concerns the justification of phase hits of the PJE type by performing a compensation. The compensation is in other words made by adding artificial partial phase hits adjacent to the PJE phase hit so that the abruptness of the whole hit is filtered. In contrast to this, the present invention proposes a solution where the clock PJE phase hits, the reference clock hits, etc., are filtered with a slow PLL circuit, as is common in the industry. Moreover, such phase hits which represent the clock contents (bit stuffing) of the tributary signal are corrected in a by-pass of the phase-locked loop. Without the by-pass solution a desynchroniser using the slow PLL would not be transparent for all such phenomenons which are allowed to the tributary unit signal.

With the aid of the arrangement according to the invention the transparency of the desynchronisers of the mentioned type will be substantially improved.

The bit stuffing by-pass method according to the invention can be applied in all desynchronisers. In a narrow bandwidth desynchroniser the method according to the invention presents two important advantages:

1) The amplitude of buffer filling variations is only one tenth or smaller than in the original narrow bandwidth desynchroniser. This means that the desynchroniser is transparent at the tributary signal interface for all specifications.
2) In the original desynchroniser the tail of the buffer fill is of the order of tens of seconds, but with the by-pass method according to the invention it will kept shorter than 0.5 s. Therefore in a desynchroniser according to the invention there occurs no interfering tributary signal delays after a transient. The ITU recommendations define 1 second as the longest switch-over time, and due to the shorter tail effect the arrangement according to the invention can better fulfil this recommendation. This is advantageous in an ITU reference model examination, where the emphasis is put on the function of the frame buffers of the switching arrangement, because no delay shares are defined for the desynchroniser.

According to the invention the best function is obtained so that the response of the VCO oscillator to the signal on the by-pass path exactly corresponds to a change in the frequency offset of the original tributary signal. This is obtained by using components with tight tolerances. However, the arrangement according to the invention provides advantages also when the tolerances do not enable a complete by-pass response at the output of the VCO.

BRIEF SUMMARY OF THE DRAWINGS

Below the invention-is illustrated in more detail with the aid of embodiment examples and with reference to the enclosed drawings, in which:

FIG. 4 shows the output jitter of a prior art narrow bandwidth desynchroniser;

FIGS. 5 to 7 show the output jitter at different frequency offsets in a desynchroniser arrangement according to the invention;

FIG. 8 shows the output jitter of a prior art narrow bandwidth desynchroniser; and FIGS. 9 and 10 shows the output jitter at different frequency offsets in a desynchroniser according to the invention;

FIG. 13 illustrates the transmission frame STM-1 of the SDH system;

FIGS. 14 and 15 illustrate a phase hit occurring at the input of a known desynchroniser and correspondingly the phase jitter occurring at the output, when the transmission rate is 140 Mbit/s and the bandwidth of the phase-locked loop is about 2 Hz; and FIG. 16 shows the block diagram of a typical desynchroniser without pointer jitter justification.

DETAILED DESCRIPTION OF THE INVENTION

Figure 1:
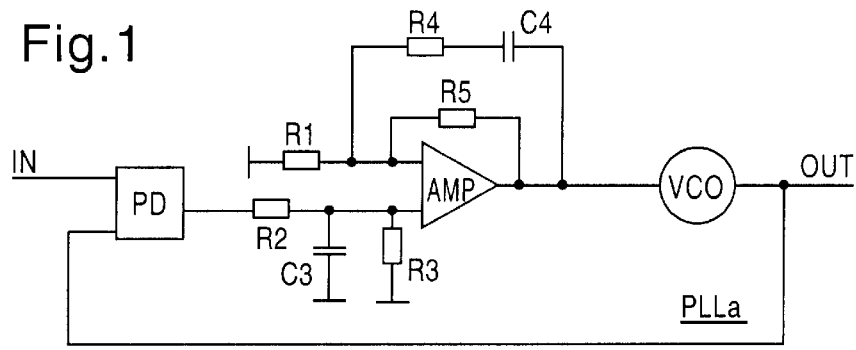
FIG. 1 shows a typical narrow bandwidth phase-locked loop of a known 2 Mbit/s desynchroniser.

In the following the invention is described in connection with signals according to the synchronous digital hierarchy SDH defined in the ITU recommendations. The frame structure STM-1, the assembly of a frame, and pointer and bit justifications of the SDH system were described above in the general description. Regarding these further reference is made to the above mentioned ITU recommendations, the above mentioned article of Ralph Urbansky, and to the Finnish patent 95636.

First we discuss a prior art solution, to which the inventive circuit arrangement can be added. FIG. 16 shows a known desynchroniser. The digital synchronous signal DATA, for instance an SDH signal formed by STM-1 frames, is supplied to the input of the buffer memory 1, from where it byte by byte is written in parallel mode into the buffer memory 1 according to the addresses generated by the write address counter 2, and further it is read out from the buffer 1 byte by byte in parallel mode according to the read addresses generated by the read address counter 3, so that a digital output signal DATAOUT of the desynchroniser is obtained. The output signal has a desired transmission rate, for instance 140 Mbit/s. The write address counter 2 generates write addresses at a rate determined by the write clock CLK1. The read address counter 3 correspondingly generates read addresses at a rate determined by the read clock CLK2. The read clock CLK2 is phase-locked to the write clock CLK1 by a phase-locked loop, which comprises a phase discriminator (PD), a low-pass filter, and a voltage controlled oscillator (VCO). The signals CLK1/N and CLK2/N are divided from the write and the read clocks and they are supplied from the counters 2 and 3 to the phase detector 4, whereby N is a divisor whose value is dimensioned according to the buffer length and the active region of the phase detector. The phase detector forms a voltage signal IN, which is proportional to the phase difference between the signals CLK1/N and CLK2/N, and which is supplied through the resistor R1 to the operational amplifier AMP. The operational amplifier AMP with its peripheral components R4, R5 and C4 forms a loop filter which gives the phase locked loop PLL a sufficient loop gain regarding the respective bandwidth. The operational amplifier AMP generates together with the voltage controlled oscillator 5 a control voltage to the control input, whereby the control voltage determines the frequency of the read clock CLK2 generated by the oscillator 5. The phase-locked loop tries to control the frequency of the read clock CLK2 so that the phase difference between the clocks CLK1 and CLK2 is sufficiently small. A desynchroniser arrangement of this type and its different variations are well known to a person skilled in the art.

However, the phase-locked lop of the desynchroniser shown in FIG. 16 as such is not able to sufficiently attenuate the phase hits, which in this context are called pointer phase hits, which are caused by the pointer justifications and which appear in the digital input signal.

With reference to the FIGS. 14 and 15 it was already mentioned that when the bandwidth of the phase-locked loop is limited the pointer jitter at the output DATAOUT of the desynchroniser can be satisfactorily attenuated, but at the same time speed and reliability of the phase-locked loop is lost.

Figure 2:
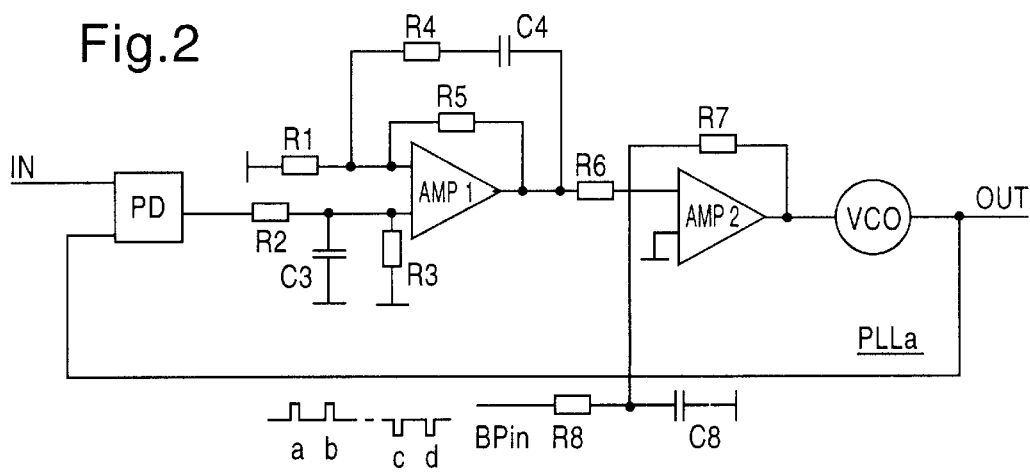
FIG. 2 shows an analogue 2 Mbit/s desynchroniser including an input signal by-pass branch according to the invention.
Figure 3:
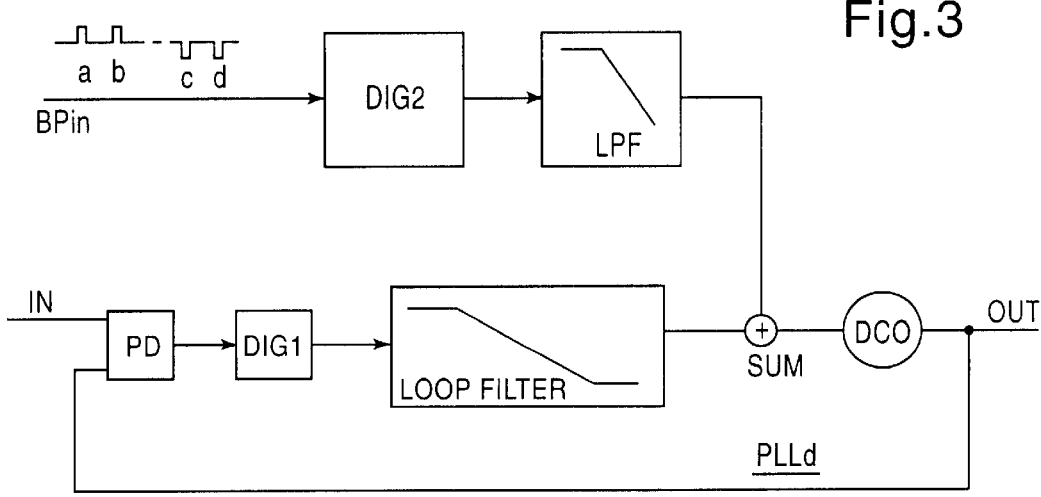
FIG. 3 shows a digital 2 Mbit/s desynchroniser including an input signal by-pass branch according to the invention.

Below we discuss the realisation of the invention, first in an analogue narrow bandwidth desynchroniser and then in a corresponding digital desynchroniser. FIG. 2 shows a by-pass circuit in the phase-locked loop of an analogue 2 Mbit/s desynchroniser. FIG. 3 shows a digital PLL loop with a tributary signal by-pass in a 2 Mbit/s desynchroniser.

With the by-pass method one can avoid problems caused by buffer filling or large swings, which occur in conventional solutions with one phase-locked loop. The method can be applied in any desynchronisers at any bit rates, but the advantages in desynchronisers of the jitter spreading type may be negligible, if the PLL is already so wide that it can avoid the delay effects caused by buffer filling variations.

FIG. 1 shows a typical narrow bandwidth phase-locked loop of a 2 Mbit/s desynchroniser. For the sake of simplicity the FIG. 1 does not show the data buffer or counters belonging to the circuit, which in the general section were treated with reference to FIG. 16. The phase-locked loop PLLa with a high Q-value will in the same simple process filter all phase hits occurring in the clock signal IN. The input signal IN is supplied to the phase discriminator PD, which as a second input has the feed-back from the oscillator VCO. The output of the phase discriminator PD is supplied through the filter circuit R2, C3, R3 to the input of the amplifier AMP, whose output is supplied to the voltage controlled oscillator VCO. The output of the amplifier is also connected in a feed-back loop through the circuits R5 and R4,C4 to the second input of the amplifier. The output of the oscillator at the same time represents the output signal OUT.

Below is presented as an example the component values of FIG. 1:

R1=330 kΩ R2=100 kΩ R3, R4=1 MΩ
R5=10 MΩ C3=100 nF C4=50 μF

According to the invention the clock signal of the tributary signal is by-passed by the analogue arrangement presented in FIG. 2, where a simple by-pass circuit is added to the narrow bandwidth phase-locked loop of the desynchroniser shown in FIG. 1. Compared to FIG. 1 it will be noted that now an amplifier AMP2 is added between the first amplifier AMP1 (AMP in FIG. 1) and the oscillator VCO in the known circuit. The by-pass signal is supplied to the input BPin (By-pass input), from where it after filtering (the components R8, C8) is supplied to the input of the amplifier AMP2, so that it is added to the output signal from the amplifier AMP1. The output of the amplifier AMP2 is connected to be the control signal of the voltage controlled oscillator VCO.

As an example a list of the additional component values is presented below:

R6, R7, R8=1 MΩ C8=100 nF.
The values of the other components can be obtained from the example in FIG. 1.

In FIG. 2 the by-pass signal BPin is formed by three-state pulses which represent bit stuffing events both upwards and downwards, and which are generated in a suitable peripheral circuit (not shown), for instance in a microcircuit particularly designed for this purpose. The signals are illustrated by pulses a, b, c, d, whose width in this example is 10 ms. The RC loop forms a simple 3 Hz low-pass filter.

Alternatively an adding amplifier (not shown) can be added to the PLL loop of FIG. 2. Then the amplifier inverts the polarity of the signal, so that the polarity must be restored in a corresponding way at the output of the phase discriminator PD.

Information about the tributary signal's frequency offset is embedded in the three-state pulse sequence BPin as "pulse frequency modulation". In the 2 Mbit/s desynchroniser the pulse width may be for instance 10 ms. Then there will occur hits at the frequency=50 ppm*2 Mbit/s=100 Hz, which corresponds to the pulse width 10 ms. The amplitude of the filtered three-state signal at the input of the voltage controlled oscillator (VCO) is selected so that it controls the VCO oscillator to generate a frequency hit, which corresponds to the original hit in the tributary signal.

Below we discuss the operation of the circuit arrangement according to FIG. 2. When the tributary signal has a frequency offset, information about this is supplied directly to the oscillator VCO, with which the frequency control is realised. Then the slow PLL loop is by-passed. The frequency hit of the clock signal supplied to the input of the phase discriminator PD appears as a phase hit having a certain slope. The by-passed signal BPin supplied to the oscillator VCO causes a similar phase hit at the output of the VCO, and in an ideal case no signal is supplied through the PLL loop to the loop filter (AMP1 with its peripheral components). However, in practice there is a small long-term correction also through the PLL loop, as described in more detail below.

In practice the information content in the three-state signal about the offset of the tributary unit signal is somewhat delayed, and the RC loop (or in a digital case the demodulation of the pulse frequency) will additionally filter it to some degree. The parameters of the filter are selected according to the jitter allowed at the output of the measuring filter. The value of that part which is caused by the bit stuffing of the jitter can be selected as for instance maximally 0.1 UI.

Because the pointer justifications and the double pointer justifications represent phase hits which are many times larger than the bit stuffing, the maximum bandwidth of the direct by-pass can be selected in a 2 Mbit/s desynchroniser so that it is 10 to 20 times the bandwidth of the phase-locked loop.

In the 2 Mbit/s case the three-state signal and the limited bandwidth of the by-pass path generate a small compensating path delay, and therefore a small rest peak amplitude is left for the filling of the data buffer. Fortunately the filling rest tail of the data buffer will be kept short (0.5 s) and its amplitude is kept low (about 8 UI in a 2 Mbit/s desynchroniser). The ITU recommendations accept switching delay tails shorter than 1 second.

Next we discuss a digital arrangement according to the invention shown in FIG. 3. In the digital modification shown in FIG. 3 the clock signal IN is supplied to the phase discriminator PD, which as a second input has the output signal OUT from the digitally controlled oscillator DCO. The output of the phase discriminator PD is digitised (DIG1) and supplied to the digital loop filter LOOP FILTER. The output of the filter is supplied to the first input of the summing circuit SUM. The digital output signal of the summing circuit SUM controls the oscillator DCO.

Information about the tributary signal offset is supplied to the arrangement according to the invention as a signal BPin, as in the case of FIG. 2. In FIG. 3 the three-state signal BPin is digitised (DIG2), digitally low-pass filtered (LPF) and supplied to the second input of the summing circuit SUM, where it is added to the control word controlling the digitally controlled oscillator DCO. The by-pass signal BPin is formed by three-state pulses, which represent bit stuffing events upwards or downwards, and which are generated in suitable peripheral circuits (not shown). The signals are illustrated by the pulses a, b, c, d, the widths of which also in this example are 10 ms.

The above in FIGS. 1 to 3 presented examples relate to the situation in a 2 Mbit/s desynchroniser. In 34 Mbit/s and 140 Mbit/s desynchronisers the structure of the by-pass channel is slightly different as the bit stuffing mechanism is different. Then the bit stuffing event pulses act only one in direction, and the pulse frequency is higher (in the 140 Mbit/s system the pulse frequency is 16 kHz and the deviation 2.1 kHz). The offset tracking can be faster, because the stuffing rate is higher. But there is further required a summed DC voltage (a summed balancing word in the digital embodiment), with which a constant DC offset is compensated. This is by no means decisive, because a slow phase-locked loop in the long run will compensate any tolerance errors in the summed DC voltage.

In 34 Mbit/s and 140 Mbit/s desynchronisers the bandwidth of the direct by-pass can be much wider than the mentioned 10 times the bandwidth of the PLL loop, because the repetition rate of the justifications is always high. In the 34 Mbit/s and 140 Mbit/s cases the bandwidth of the by-pass will not create any limitation.

Figure 6:
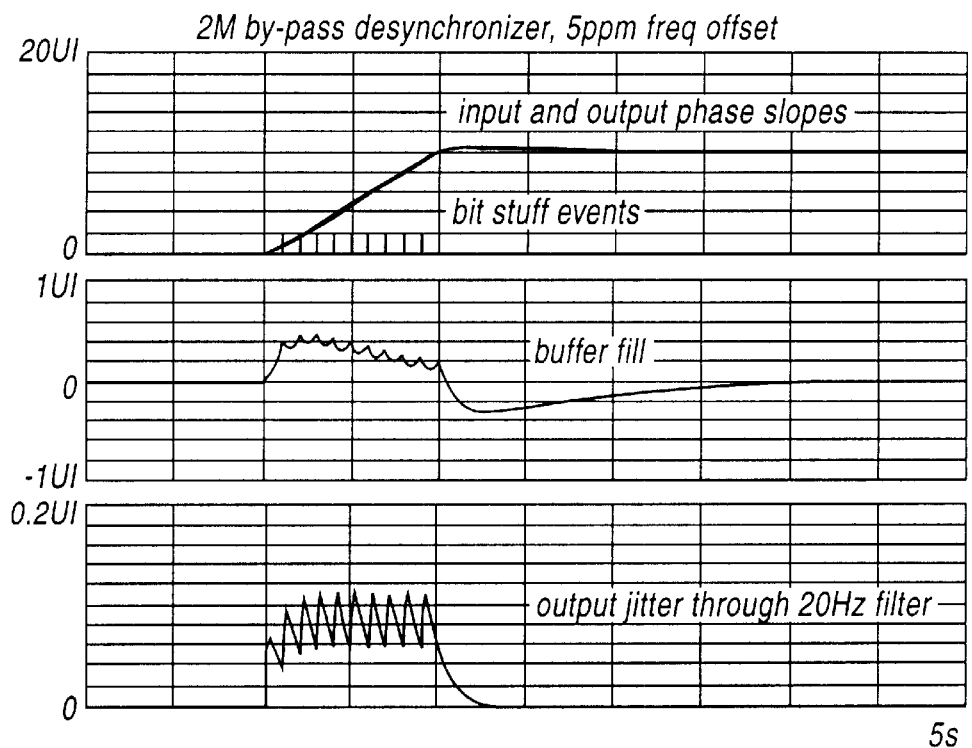
Figure 7:
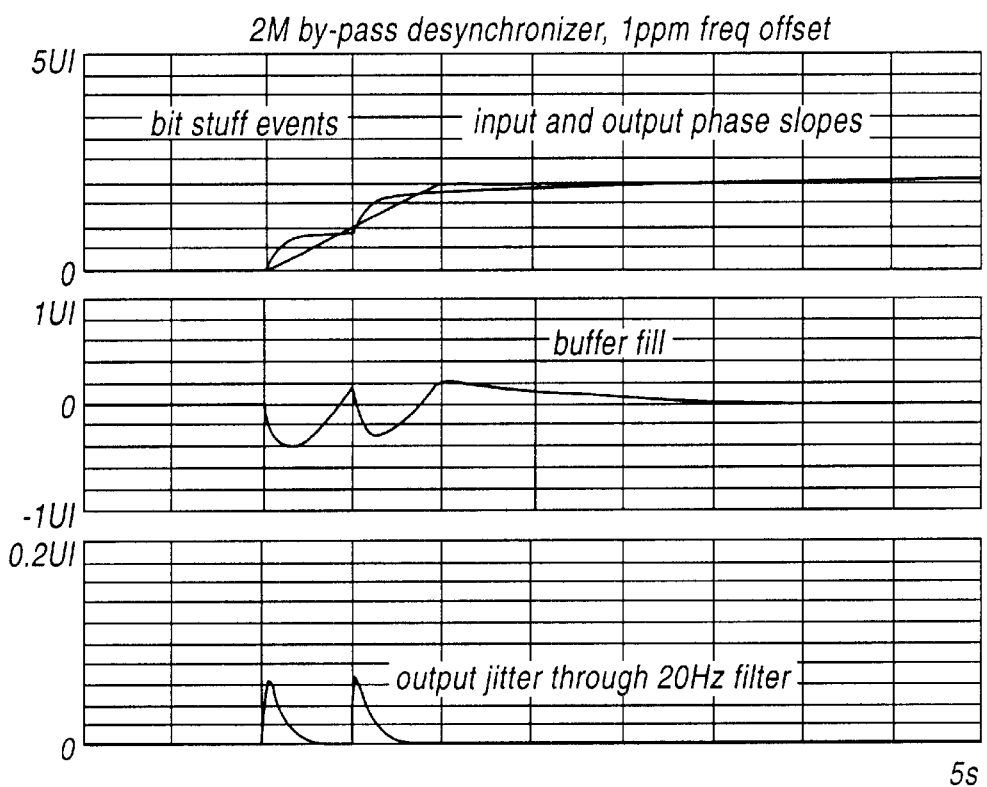
Figure 8:
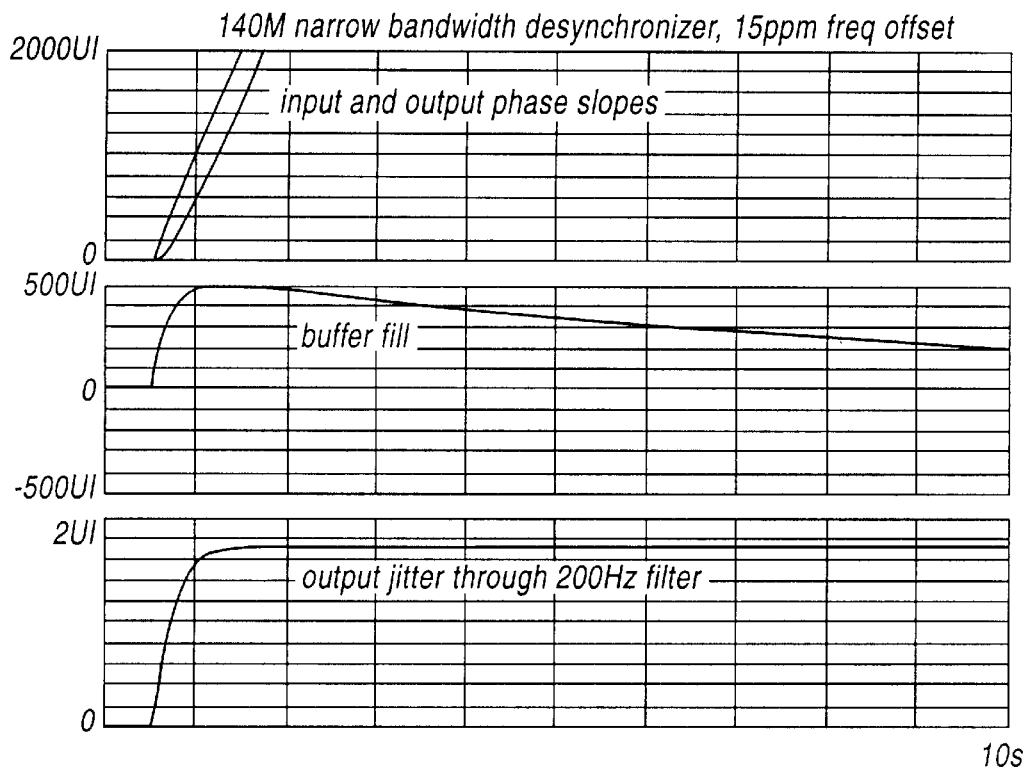
Figure 9:
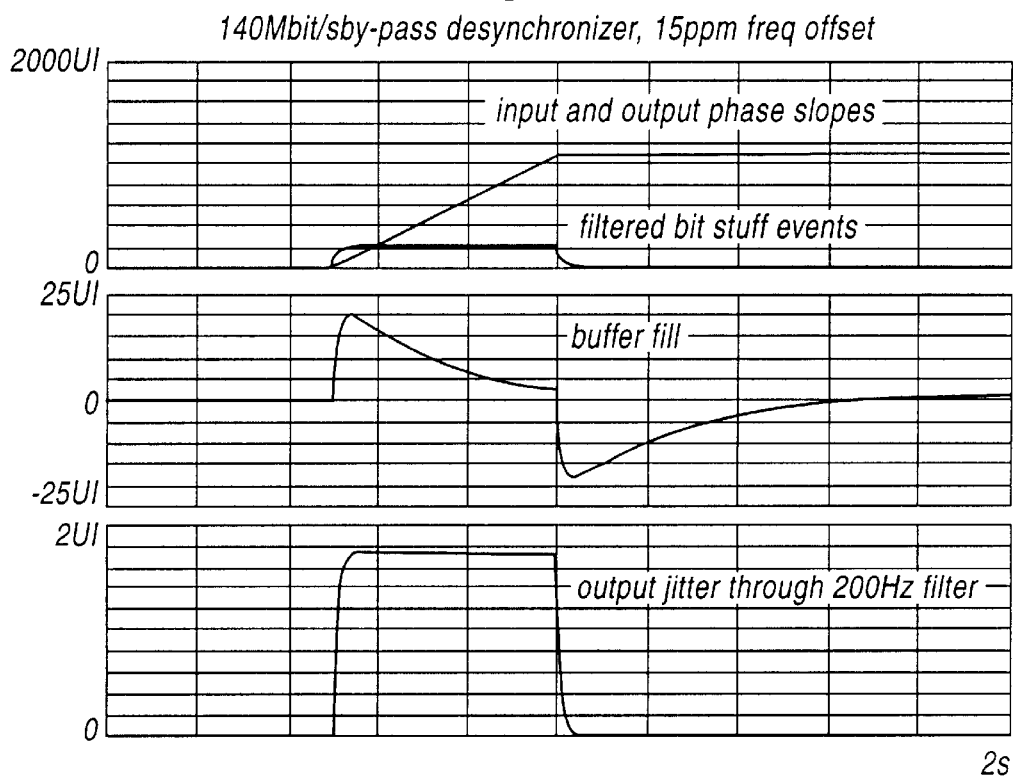
Figure 10:
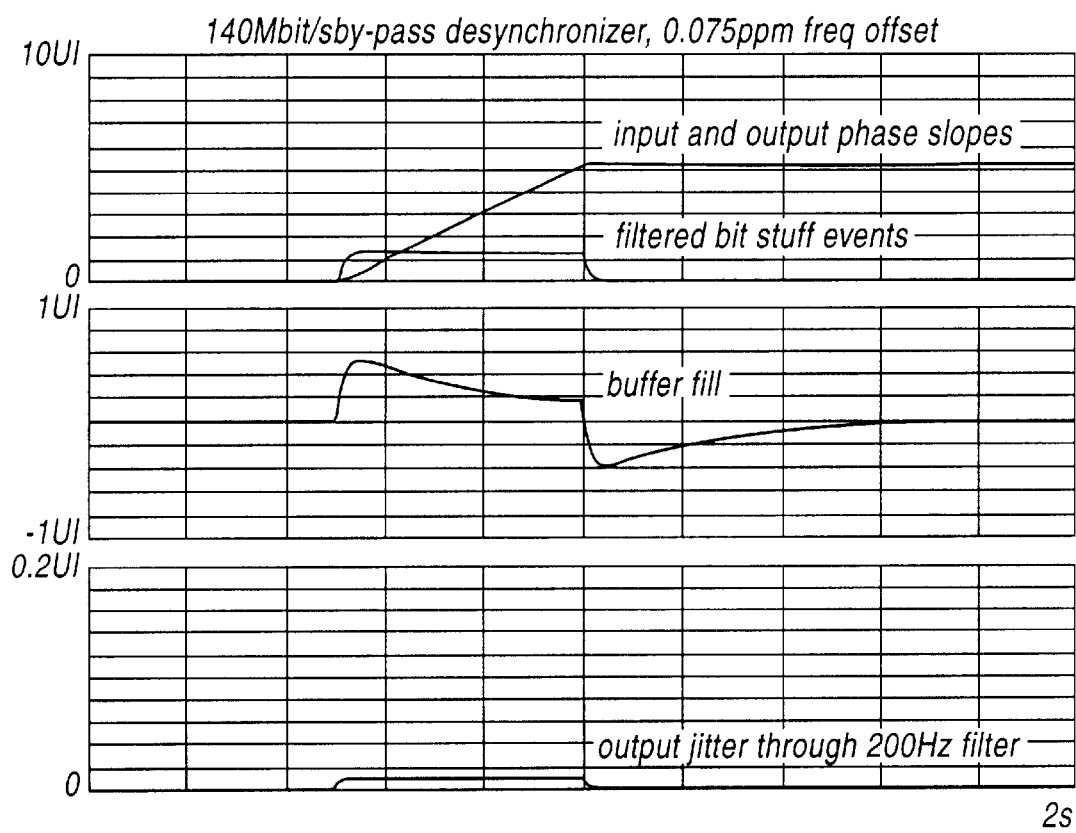

Simulation results of the arrangement according to the invention are presented in FIGS. 4 to 10, whereby the FIGS. 4 to 7 relate as examples to a 2 Mbit/s desynchroniser and the FIGS. 8 to 10 relate as examples to a 140 Mbit/s desynchroniser. On the vertical axis the unit is a frame time slot UI (unit interval) and on the horizontal axis the unit is time.

The figures present desynchroniser characteristic curves, which in these examples are:
input and output phase slopes;
buffer fill;
output jitter; and
bit stuff events.

In FIGS. 4 to 7 the output jitter is measured with a 20 Hz filter, and in FIGS. 8 to 10 there is used a 200 Hz filter.

Figure 4:
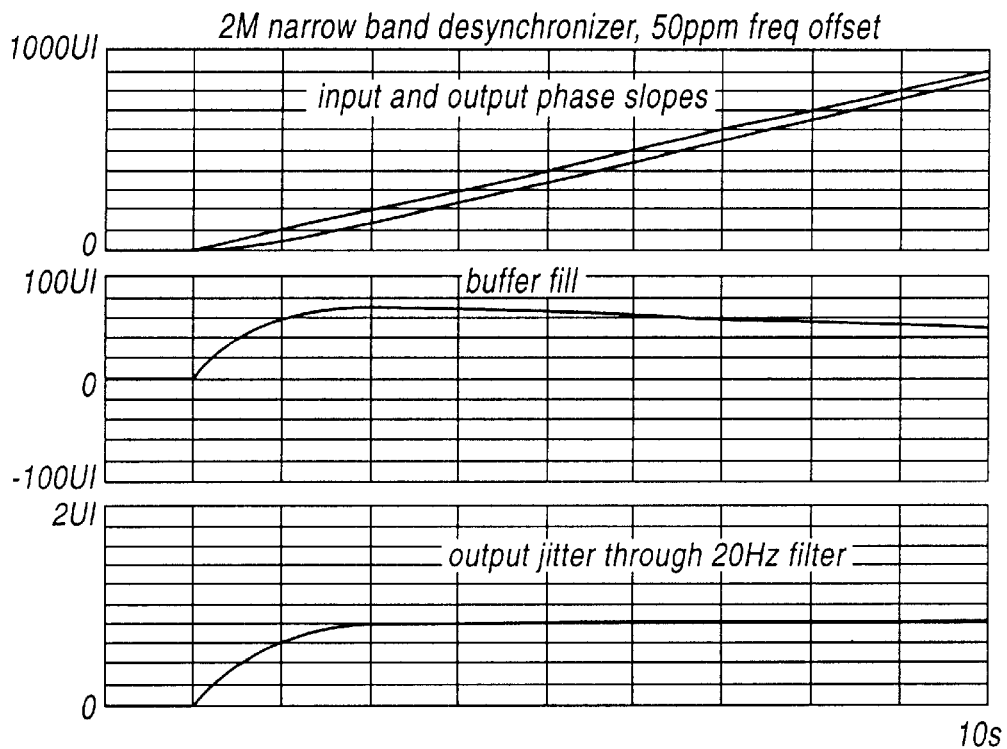
FIGS. 4 to 10 show simulation results, whereby the FIGS. 4 to 7 relate to a 2 Mbit/s desynchroniser, and the FIGS. 8 to 10 relate correspondingly to a 140 Mbit/s desynchroniser; whereby.

For the sake of comparison FIG. 4 shows the characteristics of a typical prior art narrow bandwidth 2 Mbit/s desynchroniser in connection with a tributary signal off-set transient. The frequency offset transient is 50 ppm, which in the ITU recommendations is the maximum value for changes in one direction. The height of the curve describing the buffer fill is 70 UI, and its length is tens of seconds.

Figure 5:
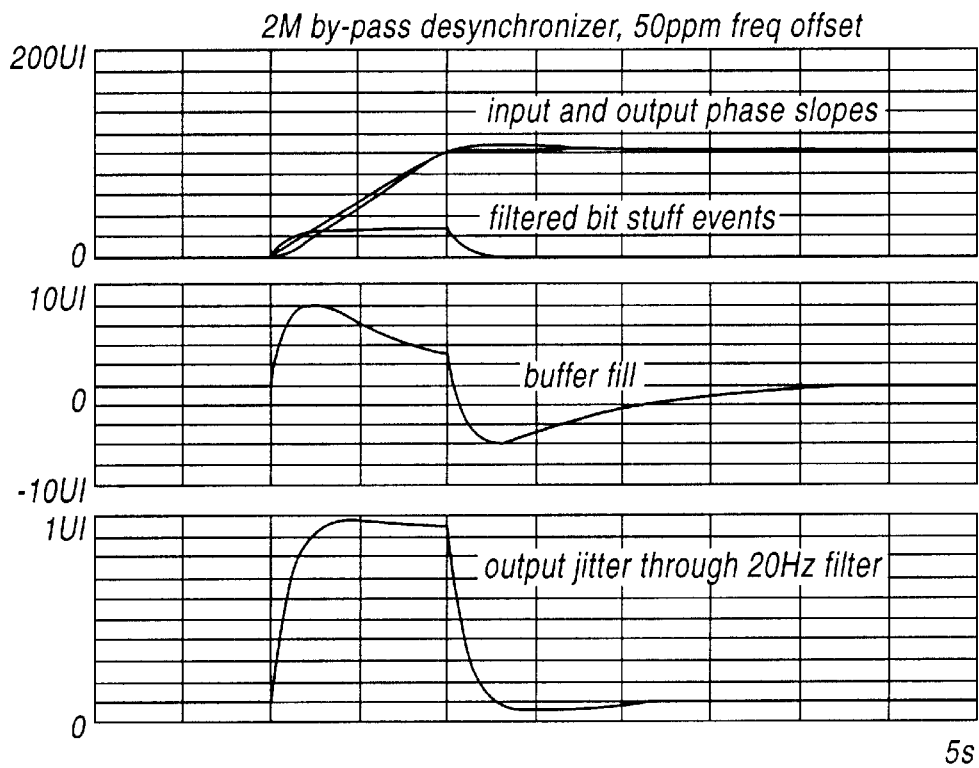

When by-passing according to the invention is used, for instance a circuit arrangement according to FIG. 2 or 3, this will provide results according to FIG. 5, when the transient is 50 ppm. The height of the curve representing buffer fill is only 8 UI, and its length is about 0.3 s. In this case the input phase slope is cut off after about 1 second, and the offset occurrences are also represented by the curve "filtered bit stuff events", which clearly shows the offset in the other direction, so that a response in the opposite direction is seen in the curve "buffer fill".

FIG. 6 shows a more interesting result for a 5 ppm transient. In this case there appears also a "reciprocating" of the bit stuff events, because the fill frequency is lower. The buffer fill is of the order of 0.4 UI.

FIG. 7 correspondingly shows the result with a 2 Mbit/s desynchroniser using the by-pass method according to the invention, when the transient is 1 ppm. During a variation having a length of one second there are only 2 bit stuff events (in the figure the peaks "bit stuff events"). Correspondingly there appears two waves in the curve representing the buffer fill.

The FIGS. 8 to 10 shows the corresponding characteristic curves for a 140 Mbit/s desynchroniser. In the FIGS. 8 and 9 the frequency offset transient is 15 ppm, and in FIG. 10 it is 0.075 ppm.

FIG. 8 shows that the buffer fill of a prior art narrow bandwidth desynchroniser (the value is about 500 UI) is stronger than in the 2 Mbit/s case (cf. FIG. 4). The FIG. 8 is presented for the sake of comparison, and there the by-pass method according to the invention is not used. Also in FIG. 9 the buffer fill, compensated according to the invention, is higher (the value is about 20 UI) than in the 2 Mbit/s case, but it is yet shorter. In the case of FIG. 10 the buffer fill stays at a value of about 0.5 UI, and the compensated output jitter is very low.

Next we discuss the effect of component tolerances on the method according to the invention. The results are presented in diagrams of the same type as above in the FIGS. 4 to 10.

Regarding the best performance the by-passed offset hit should exactly correspond to the original the tributary clock signal hit. If this is not the case the phase change supplied to the discriminator PD (FIGS. 2 and 3) will not be compensated. The un-compensated part of the phase change at the input of the circuit arrangement behaves in the same manner as the original, but with a lower amplitude. If the gain of the by-pass is set so that is deviates for instance 20% from the ideal case, then the same share, that is 20%, of the original input phase change will not be compensated for.

Figure 11:
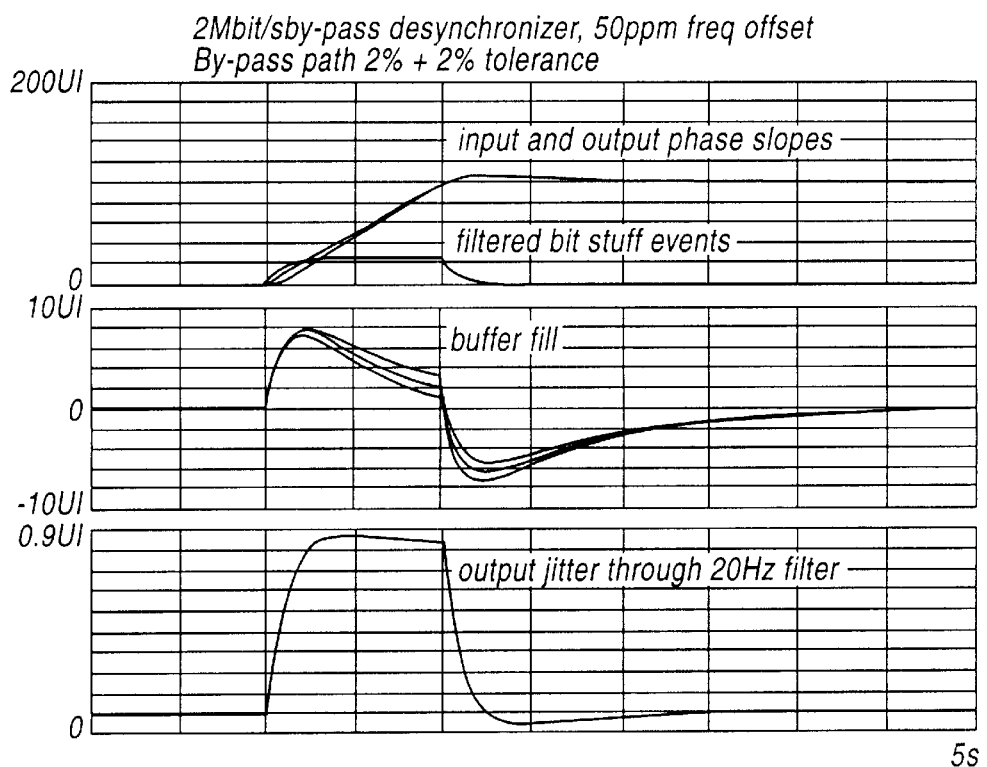
FIGS. 11 and 12 illustrate the effect of component tolerances on the characteristics of the arrangement according to the invention.

In the first test there was assumed a situation in a 2 Mbit/s desynchroniser where the matching error was 4%, which is cause by the 2% resistor tolerances and the 2% oscillator response deviation. The test results are presented in FIG. 11. The buffer fill compensation ratio was approximately 10:1, or from the value 70 UI in FIG. 4 to the value 8 UI in FIG. 11 (the curves "buffer fill").

Figure 12:
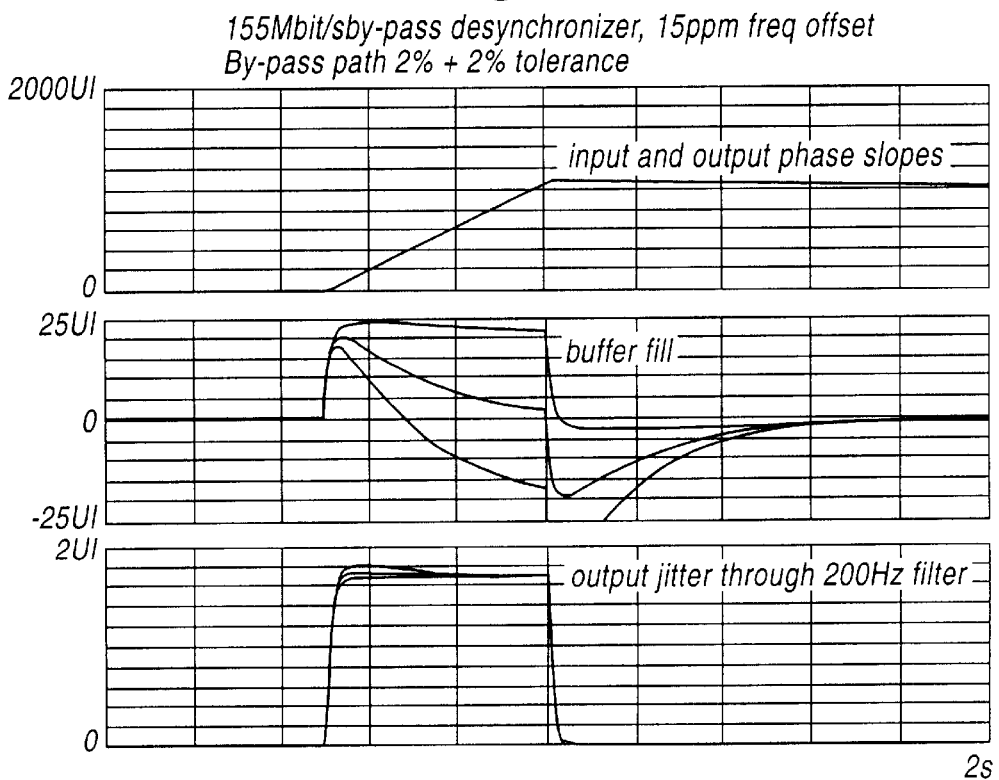

In another test was examined in the same way the behaviour of the 140 Mbit/s desynchroniser regarding the tolerances. The same tolerances were used in the first test above. The results are presented in FIG. 12, where it is seen that a compensation ratio of about 20:1 was obtained, or from the value 500 UI in FIG. 8 to the value 24 UI in FIG. 12 (the curve "buffer fill").

In the light of these tests it seems obvious that in practice the buffer fill can be reduce with the aid of the arrangement according to the invention by a ratio of about 10:1. Stronger compensation would require components with tight tolerances.

A larger response tolerance can be accepted in the analogue VCO oscillator when an analogue circuit structure is used in the arrangement according to the invention. In order to obtain good results with the by-pass method according to the invention the gain of the by-pass channel should be adjustable. Alternatively a lower compensation ratio can be accepted.

In the light of the above mentioned a digital oscillator DCO is considered more advantageous, because no sensitivity tolerances occur in it.

Regarding the 34 Mbit/s and the 140 Mbit/s desynchronisers it must be observed that the tracking speed of the by-pass channel could be designed much higher that in the above presented examples. This is due to the fact that the bit stuffing mechanism operates at a higher frequency. For instance in the 140 Mbit/s system it is 16±2.1 kHz. Jitter filtering at this frequency can be made with a fast tracking filter, and then a fast tracking causes a lower peak in the buffer fill curve. In practice the tolerance questions must be observed, because in a disadvantageous case the tolerances cancel to some degree the advantages obtained with a fast tracking.

The tracking of tributary unit signals can also be applied in other ways. Instead of a simple filtering the bit stuffing period could be measured for instance with the counter method. In this way it would be possible to have a faster determination of particularly high bit stuff frequencies, and thus the tracking of the phase change in the oscillator would be more accurate at the beginning of the transient.

What is claimed is:

1. A method to attenuate transients caused in a desynchroniser by stuffing events in a digital transmission system comprising a data buffer (1), a write address counter (2) controlled by a write clock (CLK1), a read counter (3) controlled by a read clock (CLK2), and a phase locked loop (PLLa; PLLd), which contains a phase discriminator (4, PD), a loop filter (AMP, AMP1; LOOP FILTER) and a controlled oscillator (5, VCO; DCO) for controlling the read and write clocks on the basis of a phase difference, said method comprising the steps of:

forming a pulse signal (BPin) representing justification events upwards and/or downwards caused by phase changes in a tributary unit signal;

directing the pulse signal (BPin) through second filtering means (R8 and C8; LPF); and adding the filtered pulse signal (AMP2; SUM) to the output signal of the loop filter (AMP1; LOOP FILTER), whereby the summed output signal controls the loop oscillator (VCO; DCO).

2. A method according to claim 1, wherein the desynchroniser is a narrow bandwidth desynchroniser.

3. A method according to claim 1, wherein the filtering step through second filtering means (R8 and C8; LPF) is replaced by measurement of the period length of the stuffing events.

4. A method according to claim 1, wherein the pulse signal (BPin) is a three-state pulse signal.

5. A circuit arrangement to attenuate transients caused in a desynchroniser by stuffing events in a digital transmission system comprising a data buffer (1), a write address counter (2) controlled by a write clock (CLK1), a read counter (3) controlled by a read clock (CLK2), and a phase locked loop (PLLa; PLLd), which contains a phase discriminator (4, PD), a loop filter (AMP, AMP1; LOOP FILTER) and a controlled oscillator (5, VCO; DCO) for controlling the read and write clocks on the basis of a phase difference, said circuit arrangement further comprising a by-pass input for receiving a pulse signal (BPin), whereby the pulse signal (BPin) represents justification events upwards and/or downwards, filtering means (R8 and C8; LPF) for filtering the pulse signal (BPin), and adding means (AMP2, SUM) for adding the filtered pulse signal to the output signal of the loop filter (AMP1; LOOP FILTER), whereby the added output signal controls the loop oscillator (VCO; VCO).

6. A circuit arrangement according to claim 5, wherein the filtering means (R8 and C8) for filtering the pulse signal (BPin), and the adding means (AMP2) for adding the filtered pulse signal to the output signal of the loop filter (AMP1; LOOP FILTER) are analogue circuit means.

7. A circuit arrangement according to claim 5, wherein the filtering means (LPF) for filtering the pulse signal (BPin) and the adding means (SUM) for adding the filtered pulse signal to the output signal of the loop filter (LOOP FILTER) are digital circuit means, the loop oscillator (DCO) is a digitally controlled oscillator, said arrangement further comprising:

digitising means (DIG2) at the input of the filter (LPF) for digitising the pulse signal (BPin) before the filtering; and digitising means (DIG1) at the input of the loop filter (LOOP FILTER) for digitising the output signal of the phase discriminator.

8. A circuit arrangement according to claim 5, wherein the desynchroniser is a narrow bandwidth desynchroniser.

9. A circuit arrangement according to claim 5, wherein the pulse signal (BPin) is a three-state pulse signal.

* * * * *